(12) United States Patent
Ha

(10) Patent No.: US 10,535,818 B2
(45) Date of Patent: Jan. 14, 2020

(54) RESISTANCE CHANGE MEMORY DEVICE

(71) Applicant: SK hynix Inc., Icheon (KR)

(72) Inventor: Tae Jung Ha, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/942,236

(22) Filed: Mar. 30, 2018

(65) Prior Publication Data

US 2019/0013465 A1 Jan. 10, 2019

(30) Foreign Application Priority Data

Jul. 7, 2017 (KR) .................. 10-2017-0086682

(51) Int. Cl.
  *G11C 11/16* (2006.01)
  *H01L 45/00* (2006.01)
  *G11C 13/00* (2006.01)

(52) U.S. Cl.
  CPC ...... *H01L 45/1233* (2013.01); *G11C 13/0002* (2013.01); *H01L 45/128* (2013.01); *H01L 45/1253* (2013.01); *H01L 45/146* (2013.01)

(58) Field of Classification Search
  None
  See application file for complete search history.

(56) References Cited

U.S. PATENT DOCUMENTS

| 9,000,407 B2 | 4/2015 | Wang et al. | |
| 2011/0229990 A1* | 9/2011 | Kreupl | G11C 13/0007 438/17 |
| 2015/0048299 A1* | 2/2015 | Hwang | H01L 29/8615 257/4 |

FOREIGN PATENT DOCUMENTS

KR  10-1520221 B1  5/2015

* cited by examiner

*Primary Examiner* — James G Norman

(57) ABSTRACT

A resistance change memory device is provided. The resistance change memory device includes a lower electrode, a tunneling barrier layer disposed on the lower electrode, a resistance switching layer disposed on the tunneling barrier layer, an oxygen vacancy reservoir layer disposed on the resistance switching layer, and an upper electrode disposed on the oxygen vacancy reservoir layer. The oxygen vacancy reservoir layer is electrically conductive.

19 Claims, 12 Drawing Sheets

RESISTANCE CHANGE MEMORY DEVICE

CROSS-REFERENCE TO RELATED APPLICATION

The present application claims priority under 35 U.S.C 119(a) to Korean Patent Application No. 10-2017-0086682, filed on Jul. 7, 2017, which is herein incorporated by reference in its entirety.

BACKGROUND

1. Technical Field

Various embodiments of the present disclosure generally relate to resistance change memory devices.

2. Related Art

Generally, a resistive memory is a nonvolatile memory in which an internal resistance changes or varies according to an externally applied voltage or current. The changed resistance is written in the resistive memory in a nonvolatile manner. When the internal resistance changes between a plurality of levels, the resistive memory can store a plurality of pieces of logic information. The resistive memory can be classified into a resistance change random access memory (ReRAM) device, a phase change RAM device, a magnetic RAM device, and the like, according to how the internal resistance changes.

Meanwhile, in a resistance change memory device, when a voltage is applied to both ends of a variable resistance material layer, one or more conductive filaments in the variable resistance material layer are generated or dissolved, thereby forming or destroying a conductive bridge including the conductive filaments. Alternatively, an insulating interface layer can be generated or destroyed between the variable resistance material layer and an electrode layer by the applied voltage. The applied voltage thereby writes different resistance states in the resistance change memory device. Further, the converted states of the conductive bridge or the insulating interface layer are maintained in the variable resistance material layer even after the applied voltage is removed. Therefore, the written resistance states in the resistance change memory device can be stored in a nonvolatile manner.

SUMMARY

One embodiment of the present disclosure provides a resistance change memory. The resistance change memory device includes a lower electrode, a tunneling barrier layer disposed on the lower electrode, a resistance switching layer disposed on the tunneling barrier layer, an oxygen vacancy reservoir layer disposed on the resistance switching layer and an upper electrode disposed on the oxygen vacancy reservoir layer. The oxygen vacancy reservoir layer is electrically conductive.

Another embodiment of the present disclosure provides a resistance change memory. The resistance change memory device includes a lower electrode, a first metal oxide layer disposed on the lower electrode, a second metal oxide layer disposed on the first metal oxide layer, a third metal oxide layer disposed on the second metal oxide layer, and an upper electrode disposed on the third metal oxide layer. The first metal oxide layer is electrically insulative. The second metal oxide layer includes a conductive filament. The third metal oxide layer is electrically conductive.

DETAILED DESCRIPTION

Figure 1:
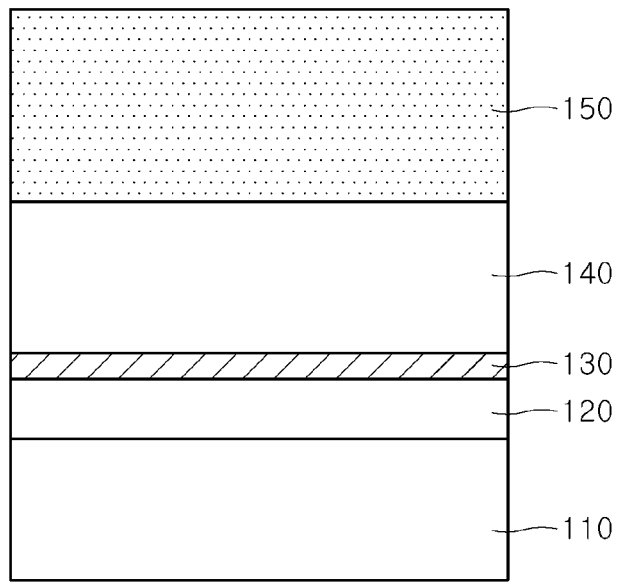
FIG. 1 is a cross-sectional view schematically illustrating a resistance change memory device according to a comparative example of the present disclosure.

Various embodiments will now be described in more detail hereinafter with reference to the accompanying drawings. In the drawings, the dimensions of layers and regions may be exaggerated for clarity of illustration. The drawings are described with respect to an observer's viewpoint. If an element is referred to as being located "on" another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof.

As used herein, "lower" and "upper" are not absolute concepts, but may be relative. For example, "lower" and "upper" can be substituted for "upper" or "lower," respectively, depending on the viewpoint of an observer.

Herein, "a low resistance state" and "a high resistance state" are not interpreted as absolute states having a respective predetermined resistance value, but can be interpreted as relative states with respect to each other. For example, in a resistance change memory device in which logic signals of "0" and "1" are respectively stored, the low resistance state and the high resistance state can be used to represent the logic signal values of "0" and "1."

An embodiment of the present disclosure provides a resistance change memory device including a lower electrode, a tunneling barrier layer, a resistance switching layer, an oxygen vacancy reservoir layer, and an upper electrode, which are sequentially stacked. In the resistance change memory device, generation positions of one or more conductive filaments (e.g., switching filaments) and one or more parasitic filaments are separated from each other, and a conduction phenomenon caused by the one or more parasitic filaments can be suppressed. Thus, using embodiments of the present disclosure, it is possible to suppress the occurrence of a resistance switching operation error by the one or more parasitic filaments.

Figure 2:
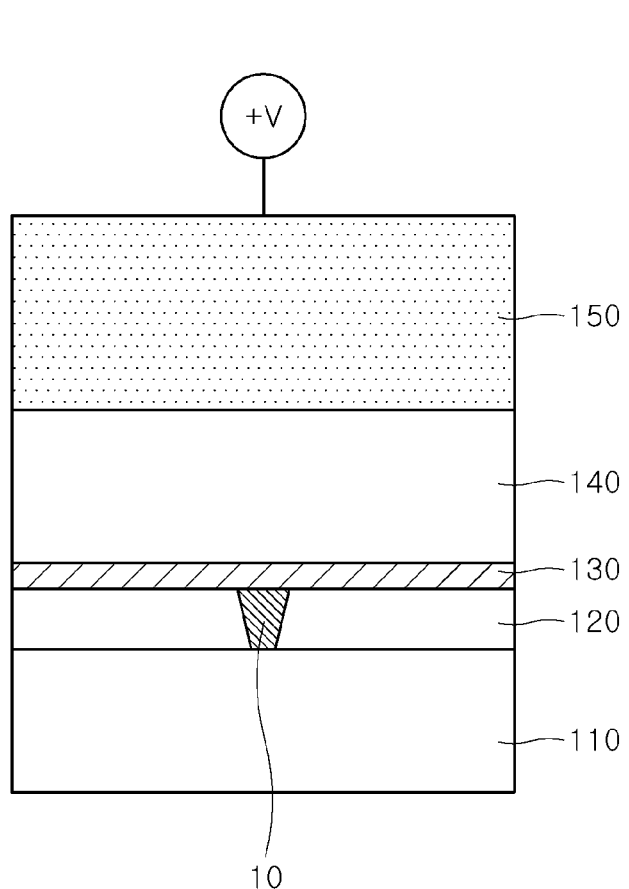
FIGS. 2 to 4 are views schematically illustrating a method of driving a resistance change memory device according to a comparative example of the present disclosure.
Figure 3:
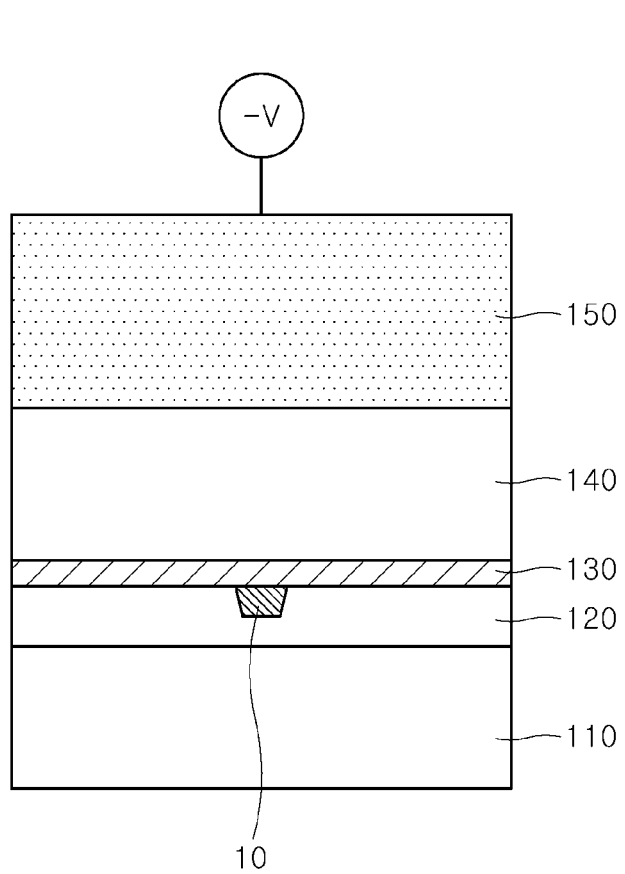
Figure 4:
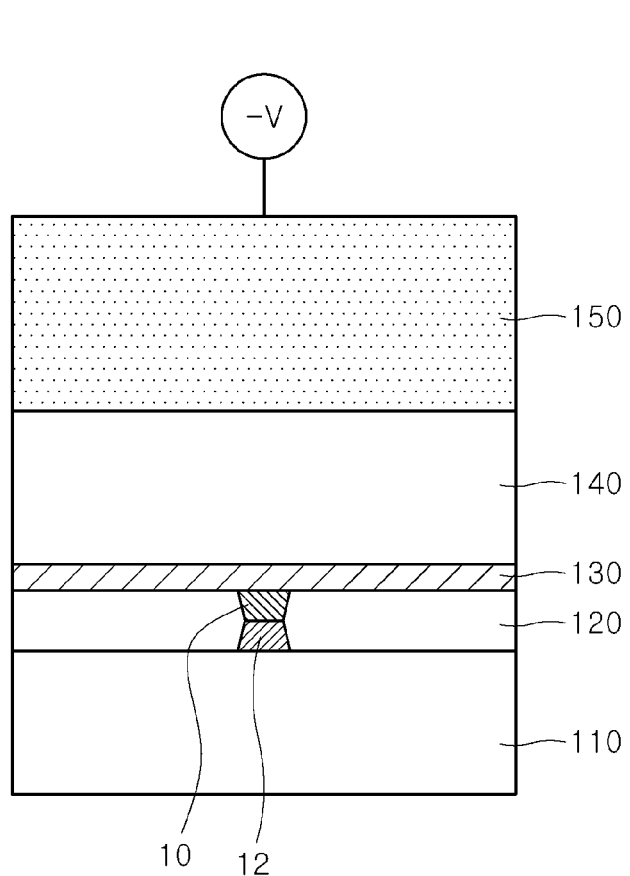

FIG. 1 is a cross-sectional view schematically illustrating a resistance change memory device 1 according to a comparative example of the present disclosure. FIGS. 2 to 4 are views schematically illustrating a method of driving the resistance change memory device 1 of FIG. 1 according to a comparative example of the present disclosure. A reset operation performed by any of the resistance change memory devices according to the comparative examples of the present disclosure have degraded reliability as compared with a reset operation performed by a resistance change memory device according to an embodiment of the present disclosure, which is to be described later with reference to FIGS. 6 to 9.

Referring to FIG. 1, the resistance change memory device 1 may include a lower electrode 110, a switching oxide layer 120, an interfacial oxide layer 130, a metal supply layer 140, and an upper electrode 150, which are sequentially stacked. The lower electrode 110 may include a conductive material. The conductive material may include, for example, a metal, a conductive metal nitride, a conductive metal oxide, or the like. For example, the lower electrode 110 may be a titanium nitride layer.

The switching oxide layer 120 may be disposed on the lower electrode 110. The switching oxide layer 120 may be a metal oxide layer having oxygen vacancies therein. In other words, the switching oxide layer 120 may include a metal oxide material that does not satisfy a stoichiometric ratio. That is, the metal oxide material may contain a stoichiometrically deficient amount of oxygen atoms compared to metal atoms. For example, the switching oxide layer 120 may be a hafnium oxide layer having oxygen vacancies therein.

The interfacial oxide layer 130 may be disposed on the switching oxide layer 120. In an embodiment, the interfacial oxide layer 130 may be a metal oxide layer that is generated as a result of a reaction between the oxygen of the switching oxide layer 120 and the metal of the metal supply layer 140. The interfacial oxide layer 130 may have a predetermined electrical conductivity. As an example, when the metal supply layer 140 is formed on the switching oxide layer 120 by a chemical vapor deposition method, the switching oxide layer 120 and the metal supply layer 140 react with each other when a thermal condition is provided in manufacturing processes. The interfacial oxide layer 130 may be formed when the switching oxide layer 120 and the metal supply layer 140 react with each other. As another example, after the metal supply layer 140 is formed on the switching oxide layer 120, the switching oxide layer 120 and the metal supply layer 140 may react with each other during a subsequent thermal process so that the interfacial oxide layer 130 may be formed. Meanwhile, the oxygen vacancies formed in the switching oxide layer 120 may result from the depletion of oxygen in the switching oxide layer 120 as the interfacial oxide layer 130 is formed.

In an embodiment, a hafnium oxide layer including $HfO_{2-x}$ (0<x<2) may be formed as the switching oxide layer 120, a tantalum layer may be formed as the metal supply layer 140, and a tantalum oxide layer including $TaO_{2.5-y}$ (0<y<2.5) may be formed as the interfacial oxide layer 130. The tantalum oxide layer may include oxygen vacancies and have a predetermined electrical conductivity.

The metal supply layer 140 may be disposed on the interfacial oxide layer 130. The metal supply layer 140 may include a metal having a high reactivity with oxygen. In an embodiment, the metal supply layer 140 may be a tantalum layer. As described above, the metal in the metal supply layer 140 and the oxygen in the switching oxide layer 120 react with each other so that the interfacial oxide layer 130 can be formed.

The upper electrode 150 may be disposed on the metal supply layer 140. The upper electrode 150 may include a conductive material. The conductive material may include, for example, a metal, a conductive metal nitride, a conductive metal oxide, or the like. In an embodiment, the upper electrode 150 may be a titanium nitride layer.

In the resistance change memory device 1 of the comparative example, which has the above-described structure, one or more conductive filaments may be generated in the switching oxide layer 120, which has the oxygen vacancies. An electrical resistance stored in the resistance change memory device 1 depends on whether the generated one or more conductive filaments electrically connect the lower electrode 110 and the metal supply layer 140 to each other. As one example, when oxygen vacancies inside the switching oxide layer 120 form one or more conductive filaments that connect the lower electrode 110 and the metal supply layer 140 to each other, the switching oxide layer 120 may have a low resistance state. As another example, when the oxygen vacancies inside the switching oxide layer 120 do not form one or more conductive filaments that connect the lower electrode 110 and the metal supply layer 140 to each other, the switching oxide layer 120 may have a high resistance state.

The operation method of the resistance change memory 1 according to one comparative example is described in detail with reference to FIGS. 2 to 4. Referring to FIG. 2, after the resistance change memory device 1 is manufactured, a forming voltage having a positive bias may be first applied to the upper electrode 150. At this time, the lower electrode 110 may be electrically grounded or may have a relatively negative bias with respect to the upper electrode 150. Oxygen vacancies distributed in the switching oxide layer 120 may be aggregated and arranged along an electric field formed by the forming voltage, so that a conductive filament 10 may be formed. In an embodiment, more than one conductive filaments 10 are formed by the forming voltage. The conductive filament 10 is arranged to connect the lower electrode 110 and the conductive interfacial oxide layer 130, so that the resistance of the resistance change memory device 1 can be switched to a lower resistance state than the initial resistance state. In other words, the conductive filament 10 is referred to as being "connected" or in a "connected state." The operation of the resistance change memory device 1 described above with reference to FIG. 2 can be referred to as a "forming" operation. After the forming operation is completed, the switching oxide layer 120 may have a low resistance state.

Referring to FIG. 3, a reset voltage having a negative bias may be applied to the upper electrode 150. At this time, the lower electrode 110 may be grounded or have a relatively positive bias with respect to the upper electrode 150. At least a part of the conductive filament 10 can be decomposed by an electric field formed by the reset voltage. That is, a part of the conductive filament 10 is dissolved or disaggregated from the rest of the conductive filament 10. When at least a part of the conductive filament 10 is decomposed, the lower electrode 110 and the conductive interfacial oxide layer 130 may be electrically disconnected from each other. In other words, the conductive filament 10 is referred to as being "disconnected" or in a "disconnected state." As a result, the resistance of the resistance change memory device 1 may be switched from the low resistance state to a high resistance state. The operation in which the conductive filament 10 of the resistance change memory device 1 is decomposed, as described above with reference to FIG. 3, can be referred to as a "reset" operation.

Referring to FIG. 4, when an absolute value of the applied voltage, which has the negative bias, is continuously increased after the reset operation is performed, i.e., the applied voltage becomes even more negative, a parasitic filament 12 may be newly grown from the end of the conductive filament 10 that had been partially decomposed during the reset operation. In an embodiment, more than one of the parasitic filaments 12 can be generated in the switching oxide layer 120. The grown parasitic filament 12 may connect the lower electrode 110 and the conductive interfacial oxide layer 130 to each other with the decomposed conductive filament 10. As a result, the resistance of the resistance change memory device 1 may be switched from the high resistance state to the low resistance state. Accordingly, when an absolute value of the applied voltage is increased to or is greater than an absolute value of the reset voltage, unintended conduction can occur between the lower electrode 110 and the upper electrode 150 by the newly grown parasitic filament 12. The creation of the parasitic filament 12 therefore reduces the reliability of the reset operation of the resistance change memory device 1. Since the unintended conduction by the newly grown parasitic filament 12 may deteriorate the reliability of the reset operation of the resistance change memory device 1, the unintended conduction needs to be suppressed in order to maintain the reliability of the reset operation.

Although not shown, a set voltage having a positive bias may be applied to the upper electrode 150 after the reset operation of FIG. 3 is performed. At this time, the lower electrode 110 may be electrically grounded or have a relatively negative bias with respect to the upper electrode 150. Along an electric field formed by the set voltage, oxygen vacancies may be grown from the disconnected conductive filament 10 of FIG. 3. When the conductive filament 10 is arranged such that it connects the lower electrode 110 and the conductive interfacial oxide layer 130 to each other, the resistance of the resistance change memory device 1 may be switched from the high resistance state to the low resistance state. The above-described switching operation of the resistance change memory device 1 may be referred to as a "set" operation.

Figure 5:
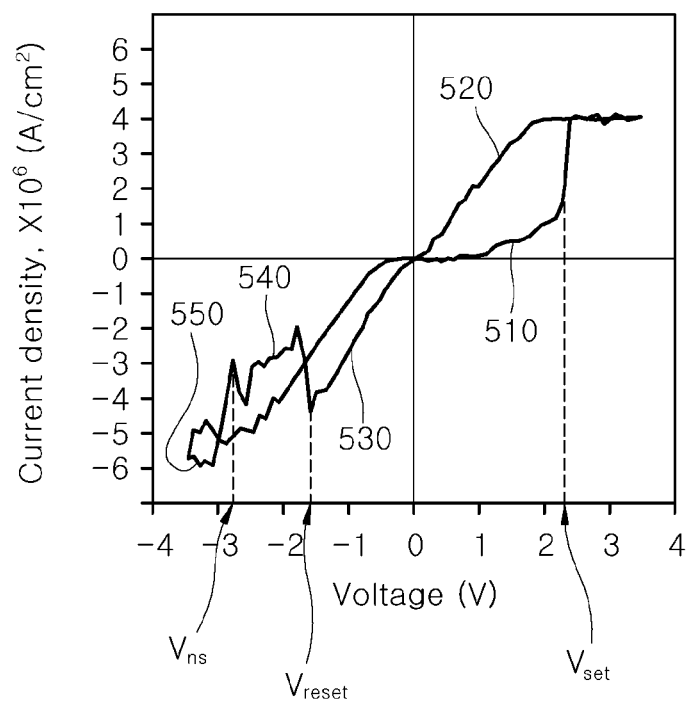
FIG. 5 is a graph illustrating electrical characteristics of a resistance change memory device according to a comparative example of the present disclosure.

FIG. 5 is a graph illustrating an electrical characteristic of a resistance change memory device according to a comparative example of the present disclosure. The characteristics of an operation current through the device with respect to a voltage applied to the device, as shown in the graph, can be derived using the resistance change memory device 1 having the configuration described above with reference to FIG. 1. The graph of FIG. 5 illustrates electrical characteristics according to the reset operation and the set operation occurring after the first forming operation described above.

Referring to FIG. 5, first, a voltage having a positive bias may be applied to the upper electrode 150 of the resistance change memory device 1 of FIG. 1, when the resistance change memory device 1 has a high resistance state. As the applied voltage increases from 0V in a positive direction, an operation current of the resistance change memory device 1 may gradually increase along a first part 510 of the graph, which corresponds to the resistance change memory device 1 having the high resistance state. When the applied voltage reaches a set voltage $V_{set}$, the operation current rapidly increases, which indicates that the resistance change memory device 1 switches to a low resistance state. As shown in FIG. 5, when the applied voltage is higher than a set voltage $V_{set}$, a current density through the resistance change memory device 1 is about $4 \times 10^6$ A/cm². Thereafter, when the applied voltage decreases again to 0V, the operation current may decrease along a second part 520 of the graph, which corresponds to the resistance change memory device 1 having the low resistance state.

On the other hand, a voltage having a negative bias may be applied to the upper electrode 150 of the resistance change memory device 1 when the resistance change memory device 1 has the low resistance state. As an absolute value of the applied negative voltage increases from 0V, i.e., as the applied voltage becomes more negative, an absolute value of the operation current may increase along a third part 530 of the graph, which corresponds to the low resistance state. When the applied voltage reaches a reset voltage $V_{reset}$, the absolute value of the operation current rapidly decreases, which indicates that the resistance change memory device 1 switches to the high resistance state. As shown in FIG. 5, a current density through the resistance change memory device 1 decreases from an absolute value of about $5 \times 10^6$ A/cm² to an absolute value of about $2 \times 10^6$ A/cm². Subsequently, when the absolute value of the applied voltage is continuously increased, the absolute value of the operation current may gradually increase along a fourth part 540 of the graph, which corresponds to the high resistance state. When the absolute value of the applied voltage reaches the conduction voltage $V_{ns}$, the absolute value of the operation current may rapidly increase again as shown in a fifth part 550 of the graph. As shown in FIG. 5, a current density through the resistance change memory device 1 increases from an absolute value of about $3 \times 10^6$ A/cm² to an absolute value of about $6 \times 10^6$ A/cm². The rapid increase of the absolute value of the operation current may be caused by the lower electrode 110 and the interfacial oxide layer 130 being reconnected by the growth of the parasitic filament 12, as described above with reference to FIG. 4. As a result, when a voltage, which has a negative bias with an absolute value that is equal to or greater than the absolute value of the reset voltage, is applied, undesired electrical conduction may occur due to the parasitic filament 12. This electrical conduction phenomenon may deteriorate the reliability of the reset operation of the resistance change memory device 1, and therefore needs to be suppressed in order to maintain the reliability of the resistance change memory device 1.

Figure 6:
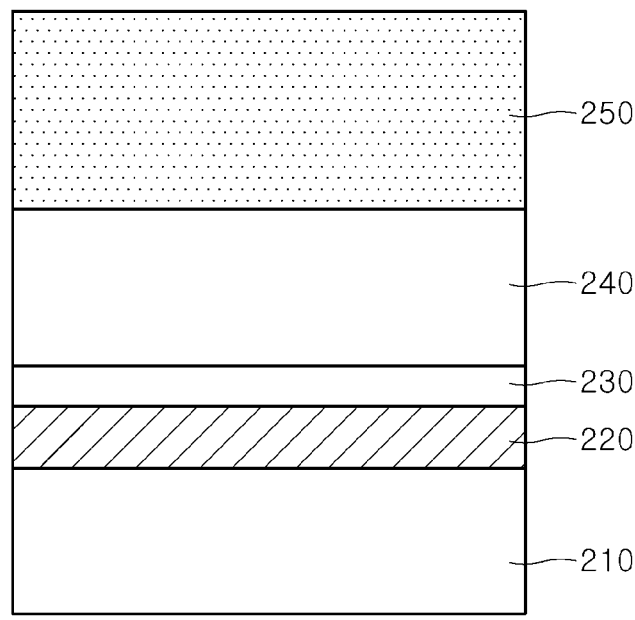
FIG. 6 is a cross-sectional view schematically illustrating a resistance change memory device according to an embodiment of the present disclosure.

FIG. 6 is a cross-sectional view schematically illustrating a resistance change memory device 2 according to an embodiment of the present disclosure. Referring to FIG. 6, the resistance memory device 2 may include a lower electrode 210, a tunneling barrier layer 220, a resistance switching layer 230, an oxygen vacancy reservoir layer 240, and an upper electrode 250.

The lower electrode 210 may include a conductive material. The conductive material may include, for example, any of a metal, a metal nitride, a metal oxide, a metal silicide, and a doped semiconductor material. The lower electrode 210 may include, for example, tungsten (W), aluminum (Al), copper (Cu), tantalum (Ta), titanium (Ti), gold (Au), platinum (Pt), silver (Ag), ruthenium (Ru), iridium (Ir), molybdenum (Mo), tungsten nitride (WN), titanium nitride (TiN), tantalum nitride (TaN), doped silicon (Si), or a combination of two or more thereof.

The tunneling barrier layer 220 may be disposed on the lower electrode 210. The tunneling barrier layer 220 may have an electrical tunneling property based on an external field applied thereto. When an external field that is equal to or lower than a predetermined threshold electric field is applied to the tunneling barrier layer 220, the tunneling barrier layer 220 may have an insulating property. On the contrary, when an external electric field that is higher than the predetermined threshold electric field is applied to the tunneling barrier layer 220, electric charges such as electrons or holes may tunnel in the tunneling barrier layer 220, so that the tunneling barrier layer 220 may be electrically conductive.

In an embodiment, the tunneling barrier layer 220 may include an insulating metal oxide material that satisfies the stoichiometric ratio. For example, the tunneling barrier layer 220 may include any of titanium oxide ($TiO_2$), aluminum oxide ($Al_2O_3$), nickel oxide (NiO, $NiO_2$, $Ni_2O_3$), copper oxide ($Cu_2O$, CuO), zirconium oxide ($ZrO_2$), manganese oxide (MnO, $MnO_2$, $Mn_2O_3$, $Mn_3O_4$, $Mn_2O_7$), hafnium oxide ($HfO_2$), tungsten oxide (WO, $WO_2$, $WO_3$, $W_2O_3$), tantalum oxide ($Ta_2O_5$), niobium oxide ($Nb_2O_5$), iron oxide (FeO, $Fe_2O_3$, $Fe_3O_4$), and the like. The above-listed nickel oxide, copper oxide, manganese oxide, tungsten oxide, and iron oxide may each have any one of the above-indicated plural formulas. In an embodiment, the tunneling barrier layer 220 may be an insulating metal oxide layer. The tunneling barrier layer 220, for example, may have a thickness of about 6 Å to about 16 Å.

The concentration of defects, such as oxygen vacancies, distributed in the tunneling barrier layer 220 may be lower than the concentration of defects distributed in the resistance switching layer 230. In addition, the oxidation potential of the tunneling barrier layer 220 may be higher than the oxidation potential of the resistance switching layer 230. That is, the metal-oxygen bonding force of the metal oxide constituting the tunneling barrier layer 220 may be greater than the metal-oxygen bonding force of the metal oxide constituting the resistance switching layer 230. Accordingly, the metal oxide in the tunneling barrier layer 220 can be more chemically stable than the metal oxide in the resistance switching layer 230. The tunneling barrier layer 220 may include, for example, hafnium oxide ($HfO_2$), zirconium oxide ($ZrO_2$), or both.

Although not illustrated, oxygen vacancies may be distributed at an interface between the lower electrode 210 and the tunneling barrier layer 220. When the lower electrode 210 and the tunneling barrier layer 220 include materials that are different from each other, the continuity of the metal-oxygen bonds in the metal oxide within the tunneling barrier layer 220 ends at the interface between the lower electrode 210 and the tunneling barrier layer 220. Therefore, oxygen vacancies may be generated at the interface, due to the disruption of the continuity of the metal-oxygen bonds. As will be described later, when an excessive external voltage is applied to the resistance change memory device 2, oxygen vacancies distributed at the interface between the lower electrode 210 and the tunneling barrier layer 220 move into inside regions of the tunneling barrier layer 220 by the external voltage, so that one or more parasitic filaments (e.g., parasitic filament 30 shown in FIGS. 8 and 9) may be formed in the tunneling barrier layer 220. That is, the oxygen vacancies at the interface move deeper inside of the tunneling barrier layer 220, and thereby form the one or more parasitic filaments.

Referring to FIG. 6 again, the resistance switching layer 230 may be disposed on the tunneling barrier layer 220. In an embodiment, the resistance switching layer 230 may include a metal oxide material. For an example, the resistance switching layer 230 may be a metal oxide layer. The resistivity of the resistance switching layer 230 in a high resistive state may be greater than the resistivities of the oxygen vacancy reservoir layer 240 and the tunneling barrier layer 220. The resistance switching layer 230 may have a thickness of about 5 Å to about 10 Å.

In an embodiment, when an external voltage is applied to the resistance change memory device 2, one or more conductive filaments may be formed in the resistance switching layer 230. The one or more conductive filaments may include oxygen vacancies. In an embodiment, the resistance state of the resistance change memory device 2 may be determined depending on the presence, shape, and arrangement of the one or more conductive filaments. As an example, when the one or more conductive filaments are formed by the external voltage, and connect the tunneling barrier 220 and the oxygen reservoir layer 240 to each other, first resistance information corresponding to a low resistance state can be written in the resistance change memory device 2. As another example, when at least a portion of the one or more conductive filaments is disconnected between the tunneling barrier layer 220 and the oxygen vacancy reservoir layer 240 by the external voltage, second resistance information corresponding to a relatively high resistance state can be written in the resistance change memory device 2.

According to an embodiment, the resistance switching layer 230 may be formed by a reaction between the tunneling barrier layer 220 and the oxygen vacancy reservoir layer 240. The resistance switching layer 230 may include oxygen vacancies. As an example, when the oxygen vacancy reservoir layer 240 is formed on the tunneling barrier layer 220 by a chemical vapor deposition method or the like in a manufacturing process, the tunneling barrier layer 220 and the oxygen vacancy reservoir layer 240 react with each other due to a thermal condition provided in the manufacturing process, so that the resistance switching layer 230 becomes an interface reaction layer. As an example, after forming the oxygen vacancy reservoir layer 240 on the tunneling barrier layer 220, the resistance switching layer 230 may be formed by performing a heat treatment so that the tunneling barrier layer 220 and the oxygen vacancy reservoir layer 240 react with each other. Accordingly, the resistance switching layer 230 may include at least one of the elements in the tunneling barrier layer 220 and at least one of the elements in the oxygen vacancy reservoir layer 240.

According to another embodiment, the resistance switching layer 230 may be deposited on the tunneling barrier layer 220 by a chemical vapor deposition method or the like. By controlling conditions of the deposition process, the amount of oxygen flowing into the resistance switching layer 230 can be controlled, so that the resistance switching layer 230 can be formed to include oxygen vacancies.

Referring to FIG. 6, the oxygen vacancy reservoir layer 240 may be disposed on the resistance switching layer 230. In an embodiment, the oxygen reservoir layer 240 may include a metal oxide material that does not satisfy the stoichiometric ratio. That is, the metal oxide material may contain a stoichiometrically deficient amount of oxygen atoms compared to metal atoms. The metal oxide material may contain oxygen vacancies therein because the material includes a stoichiometrically deficient amount of oxygen atoms.

In an embodiment, the oxygen vacancy reservoir layer 240 may be a conductive metal oxide layer. The oxygen vacancy reservoir layer 240 may have a predetermined electrical conductivity that is in proportion to the concentration of the oxygen vacancies in the material thereof. The metal oxide may include, for example, titanium oxide, aluminum oxide, nickel oxide, copper oxide, zirconium oxide, manganese oxide, hafnium oxide, tungsten oxide, tantalum oxide, niobium oxide, iron oxide, or a combination of two or more thereof. The oxygen vacancy reservoir layer 240, for example, may have a thickness of about 10 Å to about 90 Å.

On the oxygen vacancy reservoir layer 240. The upper electrode 250 may include a conductive material. The conductive material may include, for example, tungsten (W), aluminum (Al), copper (Cu), tantalum (Ta), titanium (Ti), gold (Au), platinum (Pt), silver (Ag), ruthenium (Ru), iridium (Ir), molybdenum (Mo), tungsten nitride (WN), titanium nitride (TiN), tantalum nitride (TaN), doped silicon (Si), or a combination of two or more thereof.

In an embodiment, the resistance change memory device 2 may include a hafnium oxide layer as the tunneling barrier layer 220, a hafnium-titanium oxide layer as the resistance switching layer 230, and a titanium oxide layer as the oxygen vacancy reservoir layer 240. The hafnium oxide layer may include a hafnium oxide ($HfO_2$) that satisfies the stoichiometric ratio. On the contrary, the titanium oxide layer may include, for example, a titanium oxide that does not satisfy the stoichiometric ratio. As an example, the titanium oxide that does not satisfy the stoichiometric ratio may have a form of $Ti_nO_{2n-1}$ such as $Ti_3O_5$, $Ti_4O_7$, and $Ti_5O_9$. The hafnium-titanium oxide layer may be a thin film in which hafnium (Hf), titanium (Ti), and oxygen (O) are mixed. As an example, the hafnium-titanium oxide layer may be a thin film in which non-oxidized hafnium (Hf) and titanium oxide exist in a solid mixture, or in another example, may be a thin film in which non-oxidized titanium (Ti) and hafnium oxide exist in a solid mixture. As another example, the hafnium titanium oxide layer may be a thin film in which hafnium oxide and titanium oxide are mixed.

Figure 7:
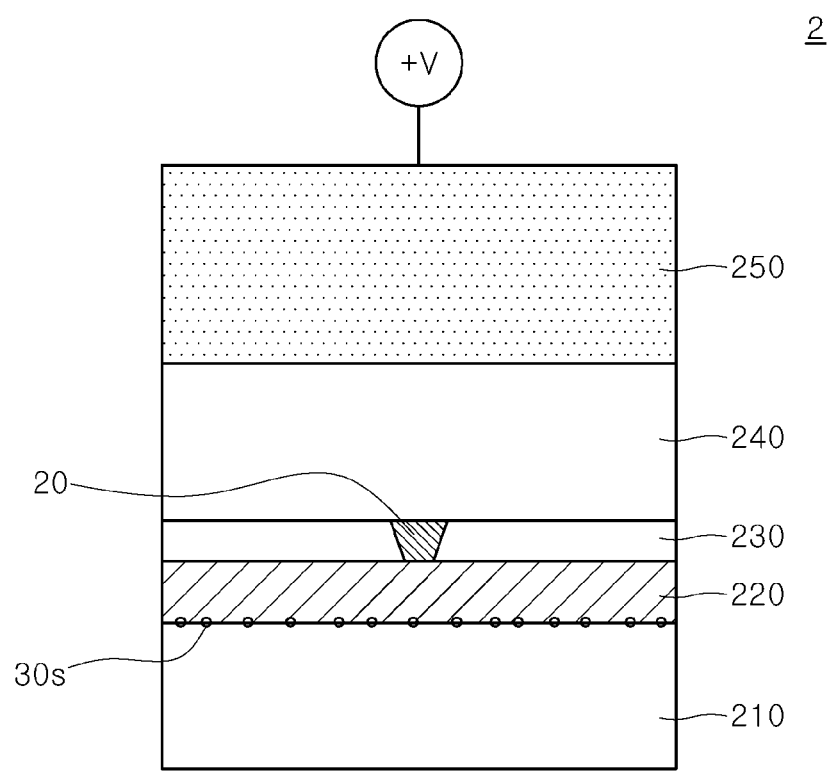
FIGS. 7 to 9 are views schematically illustrating a method of driving a resistance change memory device according to an embodiment of the present disclosure.
Figure 8:
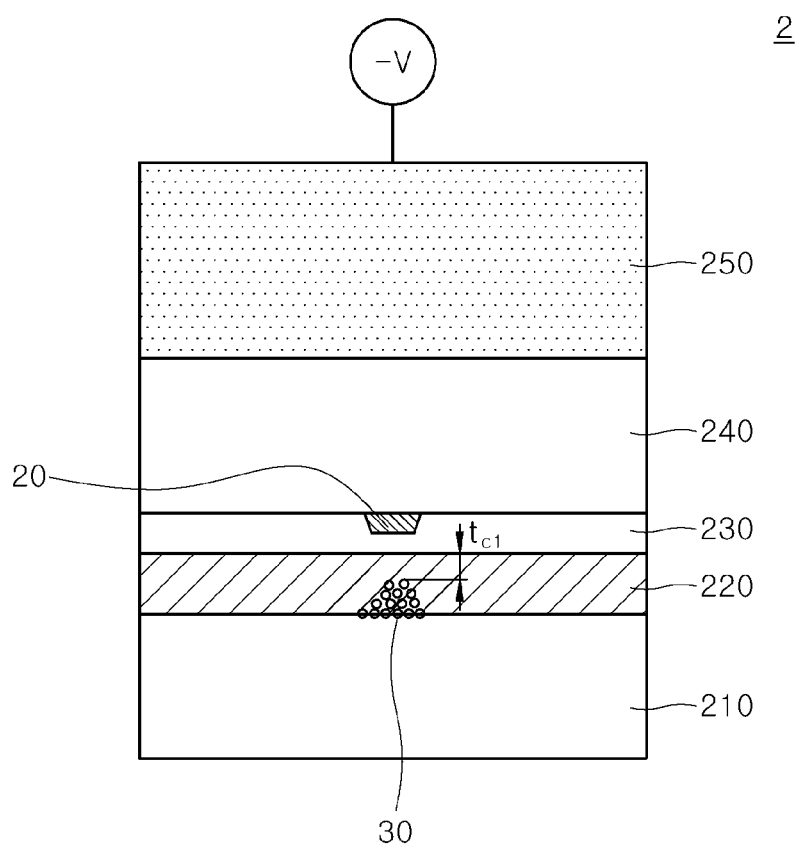
Figure 9:
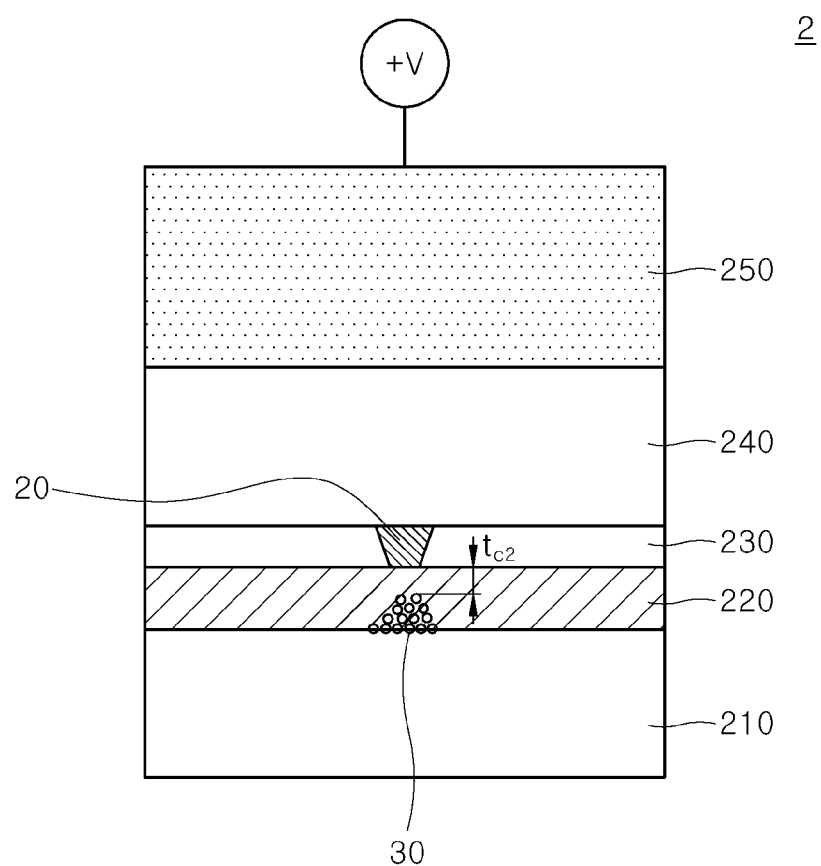

FIGS. 7 to 9 are views schematically illustrating a method of driving the resistance change memory device 2 of FIG. 6 according to an embodiment of the present disclosure. Although various steps of the method are described in a specific order of operation, other orders of operation are also possible in accordance with embodiments of the present disclosure.

Referring to FIG. 7, after manufacturing the resistance change memory device 2, a forming voltage having a positive bias may be first applied to the upper electrode 250 to perform a forming operation of the resistance change memory device 2. At this time, the lower electrode 210 may be electrically grounded or have a relatively negative bias with respect to the upper electrode 250.

The oxygen vacancies distributed in the resistance switching layer 230 may be aggregated and arranged along an electric field generated by the forming voltage, so that a conductive filament 20 may be formed in the resistance switching layer 230. In an embodiment, more than one conductive filament 20 is formed by the forming voltage. The conductive filament 20 may be arranged to connect the tunneling barrier layer 220 and the oxygen vacancy reservoir layer 240 to each other. An internal resistance of the resistance switching layer 230 can therefore be lowered. That is, the resistance switching layer 230 can be changed to a resistance state that is lower than the initial resistance state. Meanwhile, oxygen vacancies 30s may be distributed at an interface between the lower electrode 210 and the tunneling barrier layer 220. The oxygen vacancies 30s can occur because of a lack of continuity in the metal-oxygen bonds in the tunneling barrier layer 220 at the interface, such that a number of metal atoms that have not undergone stoichiometric bonding with oxygen increases at the interface.

That is, the network structure of the metal oxide in the tunneling barrier layer 220 is discontinuous at the interface with the lower electrode 210, because there are not enough oxygen atoms at the interface to continue the network structure of the metal oxide. As a result, metal atoms in the tunneling barrier layer 220 at the interface with the lower electrode 210 are non-oxidized. These metal atoms can form the oxygen vacancies 30s.

Meanwhile, after the forming voltage is removed, the conductive filament 20 may remain arranged to connect the tunneling barrier layer 220 and the oxygen vacancy reservoir layer 240 to each other. When a read voltage is applied between the lower electrode 210 and the upper electrode 250, electric charges can be conducted and pass through the oxygen vacancy reservoir layer 240, which is electrically conductive. In addition, the electric charges can pass through the resistance switching layer 230 using the conductive filament 20. Further, the electric charges can tunnel the tunneling barrier layer 220 by an electric field formed by the read voltage. As a result, the electric charges can be conducted between the lower electrode 210 and the upper electrode 250.

As described above, the conductive filament 20 connecting tunneling barrier layer 220 and the oxygen vacancy reservoir layer 240 is formed in the resistance switching layer 230, so that the resistance change memory device 2 can implement a logic signal corresponding to a low resistance state.

Referring to FIG. 8, after performing the forming operation as shown in FIG. 7, a reset operation may be performed by applying a reset voltage, which has a negative bias, to the upper electrode 250. At this time, the lower electrode 210 may be electrically grounded, or have a relatively positive bias with respect to the upper electrode 250.

At least a portion of the conductive filament 20 may be decomposed by an electric field formed by the reset voltage. When at least a portion of the conductive filament 20 is decomposed, the tunneling barrier layer 220 and the oxygen vacancy reservoir layer 240 may be electrically disconnected from each other. As a result, the internal resistance of the resistance switching layer 230 can be switched from a low resistance state to a high resistance state.

Meanwhile, when the reset voltage is applied between the upper electrode 250 and the lower electrode 210, the oxygen vacancies distributed at the interface between the lower electrode 210 and the tunneling barrier layer 220 may be aggregated, and may move into inside regions of the tunneling barrier layer 220 due to the electric field, so that a parasitic filament 30 may be formed in the tunneling barrier layer 220. That is, the oxygen vacancies at the interface move deeper inside of the tunneling barrier layer 220, and thereby form the parasitic filament 30. In an embodiment, the parasitic filament 30 may be grown from the interface into the inside of the tunneling barrier layer 220. However, since the tunneling barrier layer 220 includes metal oxides that satisfy the stoichiometric ratio, and the oxidation potential in the tunneling barrier layer 220 is relatively strong, the concentration of oxygen vacancies within the tunneling barrier layer 220 may be lower than the concentration of oxygen vacancies at the interface with the lower electrode 210. Accordingly, the parasitic filament 30 can be effectively suppressed from growing in the tunneling barrier layer 220. That is, the parasitic filament 30 can be prevented from connecting the lower electrode 210 and the resistance switching layer 230 to each other. As illustrated, the top of the parasitic filament 30 can remain spaced apart from a lower surface of the resistance switching layer 230 by a first distance $t_{c1}$.

Meanwhile, when an absolute value of the voltage applied to the upper electrode 250, which has a negative bias, continuously increases even after the reset operation is completed, the amount of decomposition of the electrolytic filament 20 in the resistance switching layer 230 may increase. At this time, the parasitic filament 30 may remain restricted from growing in the tunneling barrier layer 220 because the generation of oxygen vacancies is suppressed in the tunneling barrier layer 220, because the tunneling barrier layer 220 includes metal oxides that satisfy the stoichiometric ratio. Accordingly, even if an excessive reset voltage is applied, unintended conduction due to the parasitic filament 30 can be effectively suppressed.

Even if the parasitic filament 30 grows from the interface between the lower electrode 210 and the tunneling barrier layer 220 to the lower surface of the resistance switching layer 230 in the above reset operation, the parasitic filament 30 may not be in contact with the conductive filament 20 that has been at least partially decomposed in the resistance switching layer 230. After the conductive filament 20 is partially or fully decomposed, the conductive filament 20 is positioned such that it is spaced apart from the interface between the tunneling barrier layer 220 and the resistance switching layer 230. Therefore, the parasitic filament 30 and the conductive filament 20 can remain electrically insulated from each other.

After the reset operation is completed, the reset voltage may be removed. At this time, the parasitic filament 30 and the conductive filament 20 remain in a non-contact state. That is, the conductive filament 20 remains disconnected in the resistance switching layer 230. When a read voltage is applied, the resistance switching layer 230 can remain electrically insulative, due to the disconnected conductive filament 20, so that the resistance change memory device 2 can reliably store a logic signal corresponding to the high resistance state.

Referring to FIG. 9, after the reset operation is completed, a set operation may be performed by applying a set voltage, which has a positive bias, to the upper electrode 250 of the resistance change memory device 2. At this time, the lower electrode 210 may be electrically grounded or have a relatively negative bias with respect to the upper electrode 250.

Oxygen vacancies can grow from the disconnected conductive filament 20 along an electric field formed by the set voltage. When the conductive filament 20 is arranged such that it connects the tunneling barrier layer 220 and the oxygen vacancy reservoir layer 240 to each other, the internal resistance of the resistance switching layer 230 decreases, which indicates that the resistance switching layer 230 switches from the high resistance state to a low resistance state. That is, when the conductive filament 20 forms a conductive path through the resistance switching layer 230, the resistance change memory device 2 switches to a low resistance state.

In addition, the parasitic filament 30 can be decomposed, or the movement of oxygen vacancies in the parasitic filament 30 can be restricted, due to the electric field formed by the set voltage. Therefore, the top portion of the parasitic filament 30 can remain spaced apart from the lower surface of the resistance switching layer 230 by a second distance $t_{c2}$.

Meanwhile, after the set operation is completed, the set voltage may be removed. At this time, the parasitic filament 30 and the conductive filament 20 may remain in a non-contact state, but the conductive filament 20 may connect the tunneling barrier layer 220 and the oxygen vacancy reservoir layer 240 to each other.

When a read voltage is applied, the resistance switching layer 230 remains electrically conductive due to the arrangement of the conductive filament 20, so that the resistance change memory device 2 can reliably store a logic signal corresponding to the low resistance state.

Figure 10:
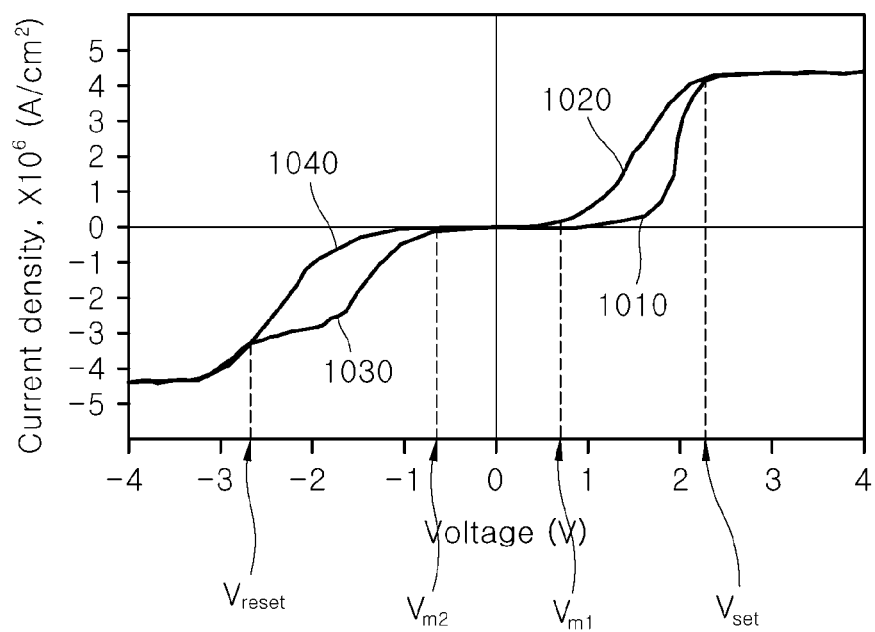
FIG. 10 is a graph illustrating electrical characteristics of a resistance change memory device according to an embodiment of the present disclosure.

FIG. 10 is a graph illustrating an electrical property of a resistance change memory device according to an embodiment of the present disclosure. The operation current characteristics with respect to the applied voltage illustrated in the graph can be derived using the resistance change memory device 2 having the configuration described above with reference to FIG. 6.

Referring to FIG. 10, a voltage having a positive bias may be applied to the upper electrode 250 of the resistance change memory device 2 having a high resistance state. As the applied voltage increases from 0V in a positive direction, the operation current may gradually increase along a first part 1010 of the graph, which corresponds to the high resistance state. When the applied voltage reaches a set voltage $V_{set}$, the resistance change memory device 2 can switch to a low resistance state. As shown in FIG. 10, a current density through the resistance change memory device 2 may increase from an absolute value of about $1 \times 10^6$ A/cm$^2$ to an absolute value of about $4 \times 10^6$ A/cm$^2$ at the set voltage $V_{set}$. Thereafter, when the applied voltage is gradually decreased to 0V, the operation current may decrease along a second part 1020 of the graph, which corresponds to the low resistance state.

At a different time, a voltage having a negative bias may be applied to the upper electrode 250 of the resistance change memory device 2, which has the low resistance state. As the absolute value of the applied negative voltage increases from 0V, an absolute value of the operation current may increase along a third part 1030 of the graph, which corresponds to the low resistance state. When the applied voltage reaches the reset voltage $V_{reset}$, the resistance change memory device 2 can switch to the high resistance state. At this time, even if the absolute value of the applied voltage is continuously increased, the absolute value of the operation current does not rapidly increase. In other words, in the graph of FIG. 10, it is illustrated that an undesired electrical conduction phenomenon due to the parasitic filament 30 does not occur, even when an excessive reset voltage that is greater than a normal reset voltage is applied. On the other hand, when the absolute value of the applied voltage is decreased to 0V again, the absolute value of the operation current may decrease along a fourth part 1040 of the graph, which corresponds to the high resistance state.

Referring to FIG. 10, when the resistance change memory device 2 has the high resistance state or the low resistance state, an extremely small operation current can flow in the threshold voltage range near 0V, that is, between the applied voltage range of $V_{m2}$ and 0V, and between the applied voltage range of 0V and $V_{m1}$. Through this phenomenon, it can be confirmed that the tunneling barrier layer 220 suppresses the conduction of current in the threshold voltage range.

Figure 11:
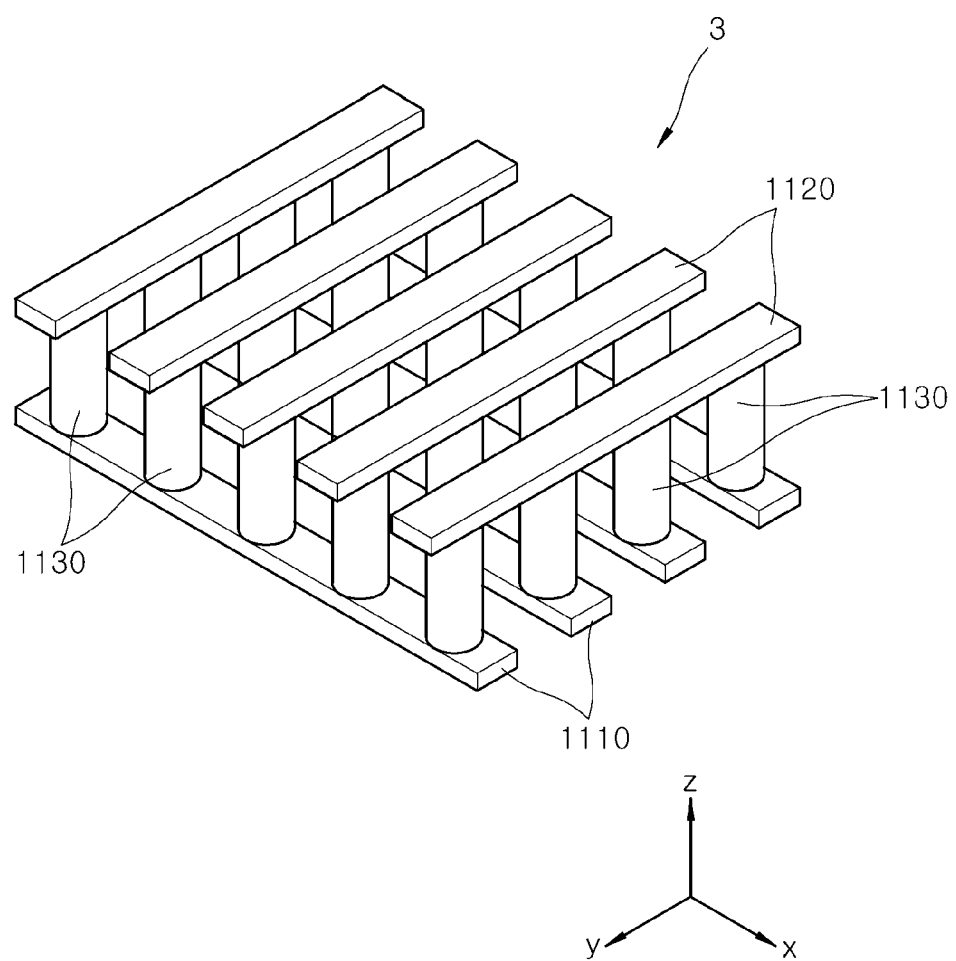
FIG. 11 is a perspective view schematically illustrating a three-dimensional nonvolatile memory device according to an embodiment of the present disclosure.
Figure 12:
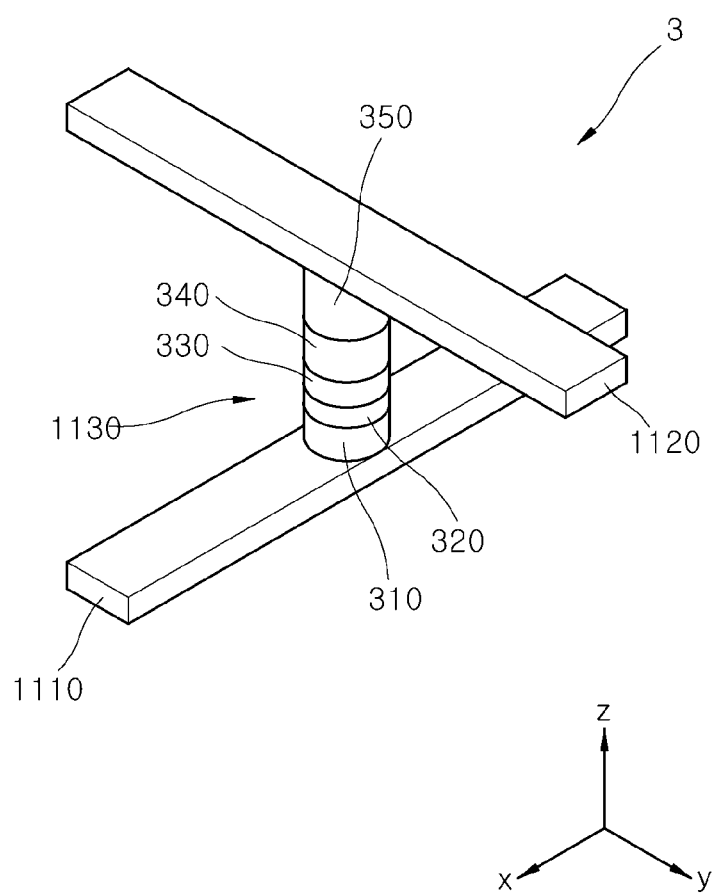
FIG. 12 is a partially enlarged view of the nonvolatile memory device of FIG. 11.

FIG. 11 is a perspective view schematically illustrating a three-dimensional nonvolatile memory device 3 according to an embodiment of the present disclosure. FIG. 12 is a partially enlarged view of the nonvolatile memory device 3 of FIG. 11.

Referring to FIG. 11, the nonvolatile memory device 3 may include first conductive lines 1110 extending in an x-direction, second conductive lines 1120 extending in a y-direction, and pillar-shaped structures extending in a z-direction at each region in which the first and second conductive lines 1110 and 1120 intersect. In the illustrated embodiment, although an orthogonal coordination system in which the x-direction and the y-direction are orthogonal to each other is illustrated, embodiments are not limited thereto, and various modifications may exist as long as the x-direction and the y-direction are not parallel. Meanwhile, the pillar-shaped structures 1130 can constitute a plurality of arrays along the x-direction and the y-direction. Each of the pillar-shaped structures 1130 can constitute a memory cell of the nonvolatile memory device 3.

Insulation layers surrounding the first and second conductive lines 1110 and 1120 and the pillar-shaped structures 1130 are omitted in FIGS. 11 and 12. Although the insulation layers are omitted for convenience of description, in practice, a variety of known insulation layers may be interposed.

Referring to FIG. 12, the pillar-shaped structure 1130 may include a lower electrode 310, a tunneling barrier layer 320, a resistance switching layer 330, an oxygen vacancy reservoir layer 340, and an upper electrode 350, which are sequentially stacked on the first conductive line 1110. The configuration of the lower electrode 310, the tunneling barrier layer 320, the resistance switching layer 330, the oxygen vacancy reservoir layer 340, and the upper electrode 350 may be substantially the same as the configuration of the lower electrode 210, the tunneling barrier layer 220, the resistance switching layer 230, the oxygen vacancy reservoir layer 240, and the upper electrode 250 of the resistance change memory device 2 described above with reference to FIGS. 6 to 9.

As described above, the resistance state of the pillar-shaped structure 1130 can be high or low depending on whether one or more conductive filaments are connected or disconnected in the resistance switching layer 330. Specifically, the one or more conductive filaments are connected or disconnected by a voltage applied between the first and second conductive lines 1110 and 1120.

Meanwhile, in this embodiment, even if one or more parasitic filaments are generated in the pillar-shaped structure 1130 during the operation of the resistance change memory device 3, an unintended conduction phenomenon can be suppressed by limiting the distribution locations of the one or more parasitic filaments within the tunneling barrier layer 320. That is, the one or more parasitic filaments and the one or more conductive filaments are prevented from contacting each other. Accordingly, a reliable resistance switching memory operation can be achieved within the pillar-shaped structure 1130.

As described above, the resistance change memory device according to an embodiment of the present disclosure includes a lower electrode, a tunneling barrier layer, a resistance switching layer, an oxygen vacancy reservoir layer, and an upper electrode, which are sequentially stacked. In the resistance change memory device according to the embodiment of the present disclosure, a switching operation, such as any of the forming operation, the set operation, and the reset operation, can be performed by variably generating or disassembling the one or more conductive filaments according to the externally applied operation voltage. The one or more conductive filaments associated with the switching operation may be formed in the resistance switching layer. The one or more parasitic filaments, which are not intentionally created by the switching operation, may be induced in the tunneling barrier layer. Further, the one or more conductive filaments and the one or more parasitic filaments can be controlled so as to remain disconnected, i.e., to maintain the non-contact state. As a result, when an excessive reset voltage is applied, a reset operation error caused by the one or more parasitic filaments unintentionally connecting to the one or more conductive filaments can be prevented.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A resistance change memory device, comprising:
a lower electrode;
a tunneling barrier layer disposed on the lower electrode;
a resistance switching layer disposed on the tunneling barrier layer;
an oxygen vacancy reservoir layer disposed directly on the resistance switching layer, the oxygen vacancy reservoir layer being electrically conductive;
an upper electrode disposed on the oxygen vacancy reservoir layer; and
a conductive filament disposed in the resistance switching layer,
wherein the oxygen vacancy reservoir layer comprises a metal oxide that contains a stoichiometrically deficient amount of oxygen atoms.

2. The resistance change memory device of claim 1, wherein the tunneling barrier layer comprises an insulating metal oxide that satisfies a stoichiometric ratio.

3. The resistance change memory device of claim 1, wherein an oxygen vacancy concentration of the resistance switching layer is higher than an oxygen vacancy concentration of the tunneling barrier layer.

4. The resistance change memory device of claim 1, wherein the metal oxide of the oxygen vacancy reservoir layer comprises one or more of titanium oxide, aluminum oxide, nickel oxide, copper oxide, zirconium oxide, manganese oxide, hafnium oxide, tungsten oxide, tantalum oxide, niobium oxide, and iron oxide.

5. The resistance change memory device of claim 1, wherein the resistance switching layer comprises one or more elements in the tunneling barrier layer and one or more elements in the oxygen vacancy reservoir layer.

6. The resistance change memory device of claim 1, wherein the conductive filament comprises oxygen vacancies.

7. The resistance change memory device of claim 1, wherein the resistance change memory device is written with a first resistance state when the conductive filament connects the tunneling barrier layer and the oxygen vacancy reservoir layer to each other, and
wherein the resistance change memory device is written with a second resistance state when the conductive filament is in a disconnected state between the tunneling barrier layer and the oxygen vacancy reservoir layer.

8. The resistance change memory device of claim 1, further comprising:
a parasitic filament disposed in the tunneling barrier layer.

9. The resistance change memory device of claim 8, wherein the conductive filament and the parasitic filament are disconnected from each other.

10. The resistance change memory device of claim 1, wherein the resistance switching layer is disposed directly on the tunneling barrier layer.

11. A resistance change memory device comprising:
a lower electrode;
a first metal oxide layer disposed on the lower electrode, the first metal oxide layer being electrically insulative;
a second metal oxide layer directly disposed on the first metal oxide layer, the second metal oxide layer comprising a conductive filament;
a third metal oxide layer disposed on the second metal oxide layer, the third metal oxide layer being electrically conductive; and
an upper electrode disposed on the third metal oxide layer,
wherein the third metal oxide layer comprises a metal oxide material that contains a stoichiometrically deficient amount of oxygen atoms.

12. The resistance change memory device of claim 11, wherein an oxidation potential of a material in the first metal oxide layer is higher than an oxidation potential of a material in the second metal oxide layer.

13. The resistance change memory device of claim 11, wherein the resistance change memory device is written with a first resistance state when the conductive filament connects the first metal oxide layer and the third metal oxide layer to each other, and
wherein the resistance change memory device is written with a second resistance state when the conductive filament is in a disconnected state between the first metal oxide layer and the third metal oxide layer.

14. The resistance change memory device of claim 11, wherein the first metal oxide layer comprises a metal oxide material that satisfies a stoichiometric ratio; and
wherein the second metal oxide layer comprises a metal oxide material that contains a stoichiometrically deficient amount of oxygen atoms.

15. The resistance change memory device of claim 14, wherein the first metal oxide layer comprises one or more of titanium oxide, aluminum oxide, nickel oxide, copper oxide, zirconium oxide, manganese oxide, hafnium oxide, tungsten oxide, tantalum oxide, niobium oxide, and iron oxide.

16. The resistance change memory device of claim 14, wherein the third metal oxide layer comprises a metal oxide material having oxygen vacancies, and
wherein the metal oxide material comprises one or more of titanium oxide, aluminum oxide, nickel oxide, copper oxide, zirconium oxide, manganese oxide, hafnium oxide, tungsten oxide, tantalum oxide, niobium oxide, and iron oxide.

17. The resistance change memory device of claim 11, wherein the second metal oxide layer comprises one or more elements in the first metal oxide layer and one or more elements in the third oxide layer.

18. The resistance change memory device of claim 11, further comprising a parasitic filament disposed in the first metal oxide layer,
wherein the parasitic filament is disconnected from the conductive filament.

19. The resistance change memory device of claim 11, wherein the first metal oxide layer comprises a tunneling barrier layer.

* * * * *